United States Patent [19]

Wess et al.

[11] Patent Number: 5,227,881
[45] Date of Patent: Jul. 13, 1993

[54] ELECTRONIC ADJUSTMENT OF VIDEO SYSTEM PARAMETERS

[75] Inventors: Raymond E. Wess, Holley; John R. Fredlund, Rochester, both of N.Y.

[73] Assignee: Eastman Kodak Company, Rochester, N.Y.

[21] Appl. No.: 787,092

[22] Filed: Nov. 4, 1991

[51] Int. Cl.[5] .................................................. H04N 5/04
[52] U.S. Cl. ..................................... 358/149; 358/160; 358/194.1
[58] Field of Search ................ 358/903, 160, 194.1, 358/148, 149, 22, 21 R; 455/198.1, 197.1, 200.1, 233.1; 340/701, 825.22, 825.73, 825.76

[56] References Cited

U.S. PATENT DOCUMENTS

| 4,038,683 | 7/1977 | Thorpe et al. | 358/19 |
| 4,498,103 | 2/1985 | Aschwanden | 358/148 |
| 4,710,800 | 12/1987 | Fearing et al. | 358/22 |
| 4,751,565 | 6/1988 | Emmons et al. | 358/19 |
| 4,837,627 | 6/1989 | Mengel | 358/194.1 |
| 4,847,698 | 7/1989 | McCauley | 358/149 |
| 4,872,054 | 10/1989 | Gray et al. | 358/140 |
| 4,907,083 | 3/1990 | Claude et al. | 358/148 |
| 4,947,256 | 8/1990 | Wood et al. | 358/22 |
| 4,952,952 | 8/1990 | Mizuno | 358/148 |
| 4,958,227 | 9/1990 | Wan | 358/148 |
| 5,005,084 | 4/1991 | Skinner | 358/194.1 |
| 5,051,827 | 9/1991 | Fairhurst | 358/160 |
| 5,150,201 | 9/1992 | Mehrgardt et al. | 358/149 |

Primary Examiner—James J. Groody
Assistant Examiner—Jeffrey S. Murrell
Attorney, Agent, or Firm—Parkhurst, Wendel & Rossi

[57] ABSTRACT

An electronic adjustment system is disclosed that includes an operator interface for entering selected digital parameter values into a non-volatile memory. A processing unit provides the digital parameter values stored in the non-volatile memory to a video circuit. The digital parameter values control certain operational parameters of the video circuit and can be easily changed by the operator to adjust the operational parameters of the video circuit without the need for adjustment switches or potentiometers.

7 Claims, 2 Drawing Sheets

ELECTRONIC ADJUSTMENT OF VIDEO SYSTEM PARAMETERS

FIELD OF THE INVENTION

The invention relates to a system for processing video signals. More specifically, the invention relates to a system for processing video signals that provides automatic electronic adjustment of various system parameters including oscillator frequency, genlock range and phase offset.

BACKGROUND OF THE INVENTION

Conventional video signal processing systems usually incorporate mechanical devices such as potentiometers and switches to set certain system parameter adjustments such as oscillator frequency, genlock frequency range and phase offset. In many cases, the potentiometers and switches may be used to preset the system parameters at the factory where the video processing system is manufactured. The potentiometers and switches, however, may not be located in a manner which permits customers and service personnel easy access to the potentiometers and switches once the video processing equipment is installed at a customer site. Thus, field adjustment of the system parameters may require the movement or partial disassembly of the video processing system to permit a service technician or customer access to the potentiometers and switches. As a result, field adjustment of the system parameters can sometimes involve a great deal of effort.

In view of the above, it would be desirable to provide a system which permits certain system parameters to be electronically adjusted without requiring access to numerous potentiometers or switches. The provision of electronic adjustment would greatly simplify the adjustment procedure and allow the genlock circuit parameters to be readily adjusted in the field by service technicians or customers.

SUMMARY OF THE INVENTION

The invention provides a system for electronically adjusting selected circuit parameters. Specifically, an electronic adjustment system is provided that includes an operator interface for entering selected digital parameter values into a non-volatile memory. A processing unit provides the digital parameter values stored in said non-volatile memory to a video circuit. The digital parameter values control certain operational parameters of the video circuit and can be easily changed by the operator to adjust the operational parameters of the video circuit without the need for adjustment of mechanical switches or potentiometers.

BRIEF DESCRIPTION OF THE DRAWINGS

With the above as background, reference should now be made to the following detailed description of the preferred embodiments of the invention and the accompanying drawings, in which.

DETAILED DESCRIPTION OF THE PREFERRED EMBODIMENTS

Figure 1:
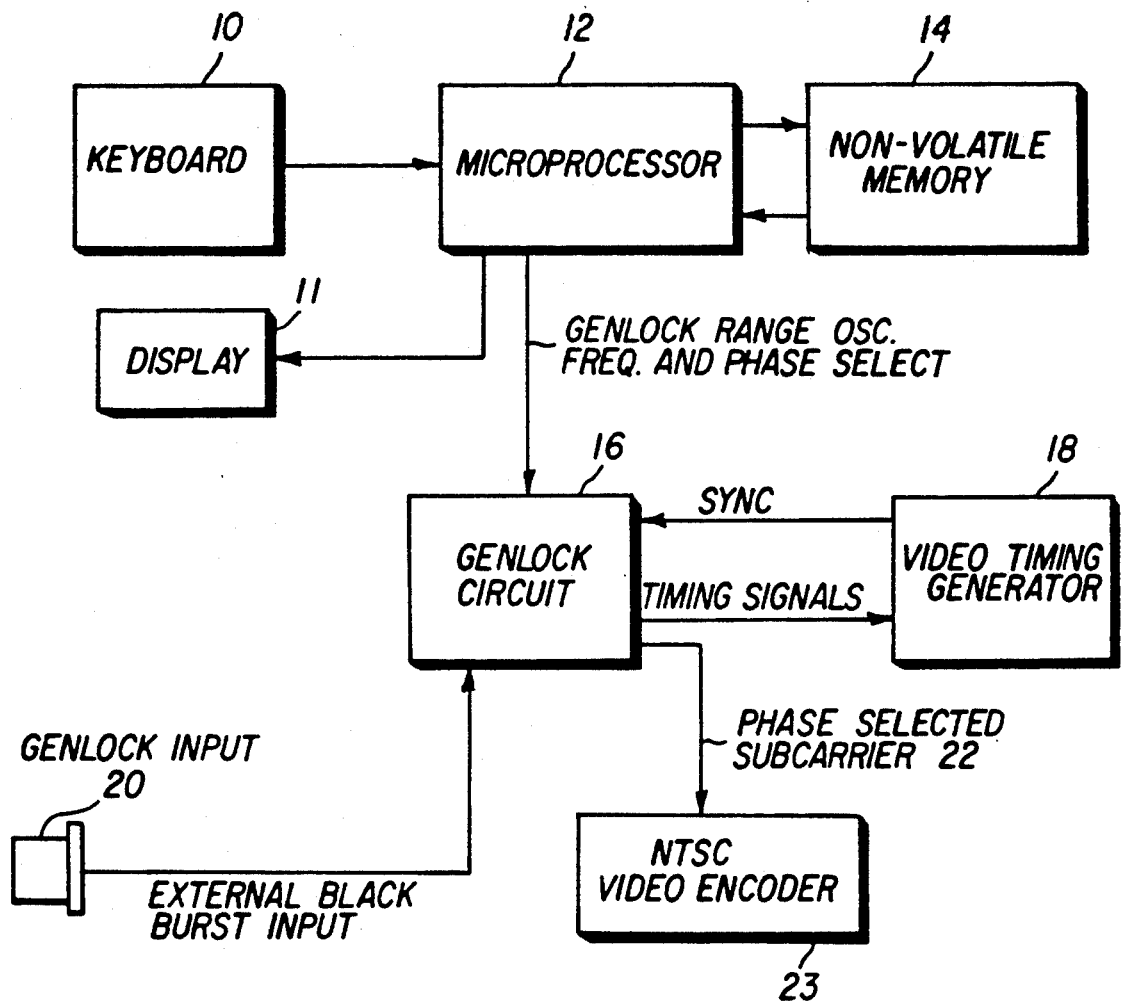
FIG. 1 is a general schematic block diagram of a video system including a genlock circuit that incorporates the present invention.

Referring now to FIG. 1, a video system is shown that includes a keyboard 10 coupled to a microprocessor 12, a display 11 and a non-volatile memory 14 coupled to the microprocessor 12, and a genlock circuit 16 coupled to the microprocessor 12 and a genlock input 20. The genlock circuit 16 receives an external black burst or RS170A input signal from the genlock input 20 and supplies timing signals to the video timing generator 18 and a subcarrier signal to a phase selected subcarrier output line 22 that is coupled to an NTSC video encoder circuit 23.

Figure 2:
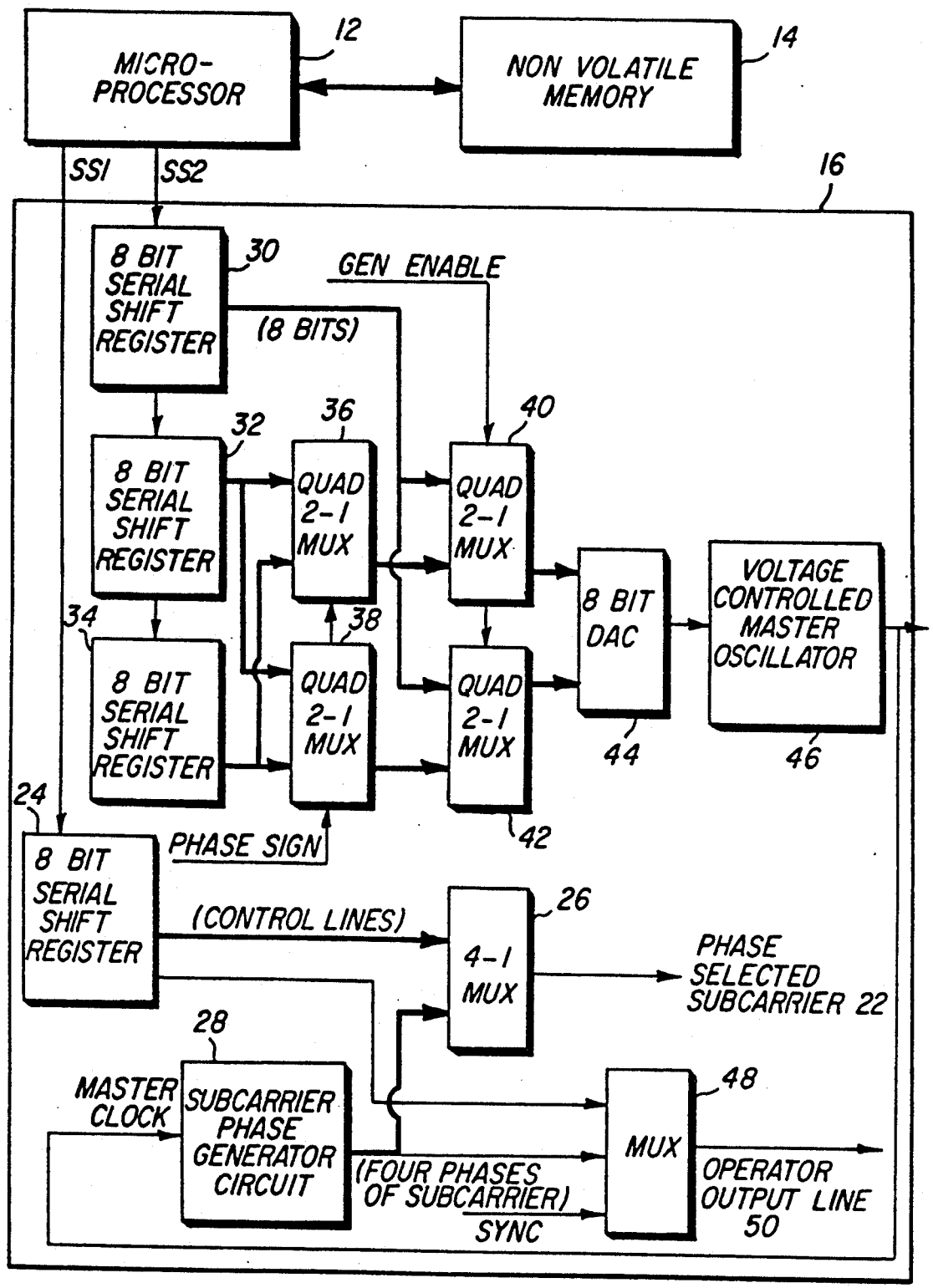
FIG. 2 is a schematic block diagram of the genlock circuit incorporated in the video system illustrated in FIG. 1.

As illustrated in FIG. 2, the genlock circuit 16 includes a serial shift register 24 that is configured to receive a first serial string (SS1) from the microprocessor 12. The first serial string is used to select the appropriate phase adjustment for subcarrier phase matching during genlock operation. The output lines of the serial shift register 24 are coupled to the control inputs of a four-to-one multiplexer (MUX) 26. The data input lines of the MUX 26 are coupled to the output lines of a subcarrier phase generator circuit 28 and the output line of the MUX 26 is coupled to the phase selected subcarrier output line 22. The subcarrier phase generator circuit 28 receives a master clock signal from a voltage controlled master oscillator 46 and generates four phases of subcarrier at ninety degree increments. Accordingly, two bits of the serial string SS1 supplied to the serial shift register 24 can be used to control the operation of the MUX 26 to select which of the four phases of subcarrier generated by the subcarrier phase generator circuit 28 will be supplied to the phase selected subcarrier output line 22.

The genlock circuit 16 includes a second group of serial shift registers 30-34 which are configured to receive a second serial string (SS2) from the microprocessor 12. As will be described in greater detail below, the first eight bits of the second serial string are used to define the lower genlock range offset, the next eight bits are used to define the upper genlock range offset, and the last eight bits of the second serial string are used to set the voltage controlled master oscillator's nominal frequency of operation. The output lines of the shift registers 32 and 34 are respectively coupled to the inputs of quad two-to-one multiplexers (QUAD MUX) 36 and 38, and the output lines of the QUAD MUXs 36 and 38 are respectively coupled to additional QUAD MUXs 40 and 42. The operation of the QUAD MUXs 36 and 38 is controlled by a PHASE SIGN control signal and the operation of the QUAD MUXs 40 and 42 is controlled by a GEN ENABLE control signal generated internally within the genlock circuit 16. The output lines of the first shift register 30 are also coupled to the QUAD MUXs 40 and 42. The output lines of the QUAD MUXs 40 and 42 are in turn coupled to the input of a digital-to-analog converter (DAC) 44. The output line of the DAC 44 is coupled to the input of the voltage controlled master oscillator 46.

An operator output line 50 is also provided to permit the operator to check selected parameters during calibration operations. The operator output line 50 is coupled to MUX 48 which is used to selectively connect the operator output line 50 to either the output of the subcarrier phase generator circuit 28 or a sync signal supplied by the video timing generator 18. The operation of the MUX 48 is controlled by the serial string that is loaded in the serial shift register 24.

During operation, the operator utilizes the keyboard 10 to select which operational parameter of the system is to be adjusted and the desired value of that parameter. Each adjustable parameter is assigned a numeric code that the operator can enter via the keyboard 10. The numeric code is supplied to the microprocessor 12 which then acknowledges the enter of the numeric code by displaying a message on the display 11. The displayed message indicates to the operator that the microprocessor 12 is ready to receive the desired value for the selected parameter. The operator enters the desired value via the keyboard 10 and the microprocessor stores the desired value in the non-volatile memory 14. The selection process continues until the operator has entered all the desired values for the adjustable parameters.

For example, to illustrate the entry of the adjustable parameter values, the operator enters a predetermined access code "001" to set the subcarrier phase adjustment. The microprocessor 12 displays a message on the display 11 prompting the operator to "Select Phase". The operator can select one of four possible subcarrier phases by entering the number 1–4 via the keyboard 10. The microprocessor 12 then stores the entered value in the non-volatile memory 14. The operator enters a new access code "002" to set the desired nominal, upper and lower frequencies. The microprocessor 12 displays a message on the display 11 to "Enter Nominal Frequency". In the most basic embodiment, the operator enters a value of 0–255 to select a desired nominal frequency, wherein each value from 0–255 represents a predetermined frequency. The microprocessor 12 stores the entered value in the non-volatile memory 14. The process is repeated to enable the operator to enter the upper and lower frequencies of the genlock range.

Although a basic data entry scheme is described above to enter the desired values for the adjustable parameters, it will be understood that a variety of more complex operator interfaces can be provided to enter the parameter values. For example, the various parameters and values can be displayed on a CRT monitor in a menu format and the operator can use a mouse or similar device to select the desired parameters and values. The method of entering the data is not particularly critical, as long as the operator selected values are supplied to the microprocessor 12 for subsequent storage in the non-volatile memory 14.

When a calibration mode of operation is selected by the operator, the microprocessor 12 supplies the necessary serial string, to the serial shift register 24 to cause the MUX 48 to supply the output signal from the subcarrier phase generator circuit 28 to the operator output line 50. The signal from the subcarrier phase generator circuit 28 is a continuous 3.58 MHz signal which is derived from the output of the voltage controlled master oscillator 46. The signal on the operator output line 50 is then monitored by the user with a frequency counter. The user then modifies the operation of the voltage controlled master operator 46 by entering a new nominal frequency parameter in the manner described above. The new parameter is supplied by the microprocessor 12 to the DAC 44 via the shift register 30, which causes the voltage controlled master oscillator 46 to change frequency. The change in the frequency of the voltage controlled master oscillator 46 causes a corresponding change in the derivative signal generated by the subcarrier phase generator circuit 28 which is subsequently measured by the user. Thus, the user can adjust the operation of the voltage controlled master oscillator 46 by entering new nominal frequency parameters until the desired frequency is measured at the user output line 50. The microprocessor 12 then stores the nominal frequency parameter corresponding to the desired frequency in the non-volatile memory 14 in response to a "select" or "set" command entered by the operator.

The high and low frequencies of the genlock range can be calibrated in a similar manner. In a preferred method of implementation, the microprocessor 12 supplies the high and low frequency parameters during the calibration operation to the serial shift register 30. Thus, the data presented to the DAC 44 is no longer that for the nominal frequency, but rather the data representative of the high or low frequency which is to be calibrated. For example, when the high frequency is to be calibrated, the microprocessor 12 loads the high frequency parameter entered by the user into the serial shift register 30. The voltage controlled master oscillator 46 will therefore run at a frequency which is determined by the value of the high frequency parameter and the operator can check and adjust the frequency by monitoring the output signal on the user output line 50. When the desired frequency has been obtained, the microprocessor 12 stores the high frequency parameter associated with the desired frequency in the non-volatile memory 14. The process is then repeated to calibrate the low frequency.

The microprocessor 12 preferably implements a correction routine during the calibration operation to insure that the user does not enter "illegal" values for the nominal, high and low frequencies. For example, the microprocessor 12 automatically raises the high frequency if the nominal frequency is changed to be within a certain range of the high frequency. The low frequency is similarly adjusted. In addition, neither the high or low frequency is allowed to come within a specified amount or range of the nominal frequency.

It should be noted that the above-described calibration routine is especially useful to counteract crystal aging effects. The nominal frequency of the master oscillator's crystal will vary over a period of time due to minute cracks in the crystal's surface caused by the manufacturing process. Methods can be implemented during the manufacturing process to limit the effects of aging, however, these methods are expensive and do not entirely eliminate aging problems. The ability to easily calibrate the nominal operating frequency of the master oscillator provided by the invention eliminates the need to use the more expensive crystals that have undergone special manufacturing processes in the master oscillator. Thus, lower cost crystals that have not undergone the special manufacturing processes can be employed in the master oscillator.

Normal operation can commence once the parameters for the nominal, high and low frequencies have been obtained and stored in the non-volatile memory 14. The microprocessor 12 loads the second serial string SS2, consisting of the previously stored nominal, high and low frequency parameters, into the respective serial shift registers 30–34. The microprocessor 12 supplies the first serial string SS1, consisting of a selected phase parameter entered by the operator, to the shift register 24 to select the appropriate phase adjustment for subcarrier phase matching during genlock operation and to switch the MUX 48 to normal operation, i.e. the SYNC signal is supplied to the operator output line 50.

If genlocking is not enabled, i.e. the GEN ENABLE control signal is not activated, the output of the shift register 30 will be passed through the QUAD MUXs 40 and 42 to the DAC 44. The voltage controlled oscillator will therefore be controlled based on the eight bits of data stored in the shift register 30 which represent the desired nominal frequency set by the operator. If genlocking is enabled, i.e., the GEN ENABLE control signal is activated, the output signals from the QUAD MUXs 36 and 38 will be passed through the QUAD MUXs 40 and 42 to the DAC 44. The output of the QUAD MUXs 36 and 38 are controlled by the PHASE SIGN control signal such that the activation of the PHASE SIGN control signal determines whether the data in the shift registers 32 and 34, representative of the upper or lower genlock range offset selected by the operator, are to be supplied to the DAC 44 to control the voltage controlled oscillator.

The invention provides the advantage of enabling an operator to easily set selected system parameters without requiring the adjustment of several mechanical switches or potentiometers. For example, it will be appreciated by those familiar with the art that conventional systems require the adjustment of a mechanical switch to set the phase of the subcarrier. Conventional systems also use a potentiometer to set the master oscillator to a desired frequency, whereas the invention enables an upper and lower frequency range, as well as the nominal frequency, to be set by the operator without requiring the adjustment of potentiometers. The invention also provides the means to easily adjust the range of genlock to allow the user to customize the system depending on system requirements. For example, the user can increase the range of genlock, thereby producing a larger locking range, or decrease the range of genlock, thereby reducing the amount of line to line video jitter which is present in a genlock system.

What is claimed is:

1. An electronic adjustment system for setting selected parameters in a video system, said electronic adjustment system comprising:
   non-volatile memory means for storing selected digital parameter values supplied by an operator interface means coupled to the non-volatile memory means; and processing means, coupled to the non-volatile memory means, for supplying the digital parameter values stored in said non-volatile memory means to a video circuit;
   wherein said video circuit comprises a first register means for receiving a first serial data string from said processing means and second register means for receiving a second serial data string from said processing means; first multiplexing means including an input coupled to outputs of the first register means and a subcarrier phase generator that generates a plurality of subcarrier signals; second multiplexing means including an input coupled to an output of said second register means and including an output coupled to an input of a digital-to-analog converter; and a voltage controlled oscillator having an input coupled to an output of the digital-to-analog converter; and wherein the digital parameter values control the operation of the video circuit.

2. An electronic adjustment system as claimed in claim 1, wherein said video circuit comprises a genlock circuit.

3. An electronic adjustment system as claimed in claim 1, wherein said first multiplexing means selects one of said plurality of subcarrier signals generated by the subcarrier phase generator based on the first serial string supplied to the first register means; and wherein said second multiplexing means selectively supplies a portion of the second serial string to the digital-to-analog converter, wherein the operation of the voltage controlled oscillator is controlled in response to the portion of the second serial string supplied to the digital-to-analog converter.

4. An electronic adjustment system as claimed in claim 3, wherein the second serial string includes a first data word corresponding to a desired nominal frequency, a second data word corresponding to a desired high frequency, and a third data word corresponding to a desired low frequency.

5. An electronic adjustment system as claimed in claim 4, wherein the processing means evaluates the first, second and third data words to determine whether the high frequency is above the nominal frequency by a predetermined amount and whether the low frequency is below the nominal frequency by a predetermined amount; and wherein the processing means adjusts at least one of the first, second and third data words to maintain a predetermined range between the high frequency and the nominal frequency and the low frequency and the nominal frequency if the high frequency is not above the nominal frequency by the predetermined amount or the low frequency is not below the nominal frequency by the predetermined amount.

6. An electronic adjustment system as claimed in claim 3, wherein said second register means includes first, second and third shift registers and said second multiplexing means includes first and second multiplexers coupled to said first and second shift registers, and third and fourth multiplexers coupled to outputs of said first and second multiplexers and said third shift register.

7. An electronic adjustment system as claimed in claim 1, further comprising third multiplexing means including an input coupled to the outputs of the first register means and the subcarrier phase generator, and an output coupled to an operator output line, wherein the third multiplexing means selectively couples the output of the subcarrier phase generator to the operator output line in response to the first serial data string supplied to the first register means from said processing means in a calibration mode of operation.

* * * * *